United States Patent
Somaduroff (10) Patent No.: US 10,498,447 B2
(45) Date of Patent: Dec. 3, 2019

(54) OPTICAL DATA TRANSMISSION WITHIN CIRCUIT BOARD SUBSTRATE

(71) Applicant: Rolls-Royce Corporation, Indianapolis, IN (US)

(72) Inventor: Robert Richard Somaduroff, Indianapolis, IN (US)

(73) Assignee: Rolls-Royce Corporation, Indianapolis, IN (US)

( * ) Notice: Subject to any disclaimer, the term of this patent is extended or adjusted under 35 U.S.C. 154(b) by 0 days.

(21) Appl. No.: 15/875,762

(22) Filed: Jan. 19, 2018

(65) Prior Publication Data
US 2019/0229807 A1   Jul. 25, 2019

(51) Int. Cl.
G02B 6/02    (2006.01)
H04B 10/25   (2013.01)
H05K 1/02    (2006.01)

(52) U.S. Cl.
CPC ..... H04B 10/2504 (2013.01); G02B 6/02038 (2013.01); H05K 1/024 (2013.01); H05K 1/0243 (2013.01); H05K 1/0298 (2013.01)

(58) Field of Classification Search
None
See application file for complete search history.

(56) References Cited

U.S. PATENT DOCUMENTS

| | | | | |
|---|---|---|---|---|
| 4,537,469 A | * | 8/1985 | Kircher | B64C 1/06 385/13 |
| 4,907,132 A | * | 3/1990 | Parker | D03D 15/00 362/556 |
| 4,998,796 A | | 3/1991 | Bonanni et al. | |
| 6,005,991 A | | 12/1999 | Knasel | |
| 6,549,710 B2 | | 4/2003 | Simmons et al. | |
| 7,149,376 B2 | | 12/2006 | Uchida et al. | |
| 7,425,286 B2 | * | 9/2008 | Ouchi | G02B 6/132 205/78 |
| 2005/0063638 A1 | * | 3/2005 | Alger | G02B 6/4214 385/15 |
| 2005/0106368 A1 | | 5/2005 | Ha et al. | |

OTHER PUBLICATIONS

Selviah, "Polymer Multimode Waveguide Optical and Electronic PCB Manufacturing", Proceedings of SPIE—The International Society for Optical Engineering—Feb. 2009, 11 pp.

* cited by examiner

*Primary Examiner* — Chad H Smith
(74) *Attorney, Agent, or Firm* — Shumaker & Sieffert, P.A.

(57) ABSTRACT

This disclosure describes circuit boards configured for optical data transmission using fibers of the reinforcing material of the circuit board substrate as optical fibers. The disclosure is directed to circuit boards that include a plurality of fibers and a dielectric matrix material. Each fiber of the plurality of fibers includes a core material substantially transparent to a wavelength range of interest and a cladding material. The refractive index of the cladding material is less than a refractive index of the core material. The plurality of fibers are interwoven in a weave. The weave is at least partially encapsulated by the dielectric matrix material. The weave provides structural support for the circuit board and a plurality of optical paths for optical signals.

18 Claims, 6 Drawing Sheets

OPTICAL DATA TRANSMISSION WITHIN CIRCUIT BOARD SUBSTRATE

TECHNICAL FIELD

The disclosure relates to circuit boards.

BACKGROUND

Components of printed circuit boards may send and receive data signals to and from other components of the same or different printed circuit boards using electrical contacts made from, e.g., copper or other conductive material connections.

SUMMARY

In one example, the disclosure is directed to circuit boards that include a plurality of fibers and a dielectric matrix material. Each fiber of the plurality of fibers includes a core material substantially transparent to a wavelength range of interest and a cladding material. The refractive index of the cladding material is less than a refractive index of the core material. The plurality of fibers are interwoven in a weave. The weave is at least partially encapsulated by the dielectric matrix material. The weave provides structural support for the circuit board and a plurality of optical paths for optical signals.

In another example, the disclosure is directed to a method of forming a circuit board. The method includes weaving a plurality of fibers to define a weave. Each fiber of the plurality of fibers comprises a core material substantially transparent to a wavelength range of interest and a cladding material. The refractive index of the cladding material is less than a refractive index of the core material. The method also includes at least partially encapsulating the weave in a dielectric matrix material. The weave provides structural support for the circuit board and a plurality of optical paths for optical signals.

The details of one or more examples of the disclosure are set forth in the accompanying drawings and the description below. Other features, objects, and advantages of the disclosure will be apparent from the description and drawings, and from the claims.

DETAILED DESCRIPTION

The disclosure describes circuit boards configured for optical data transmission using fibers of the reinforcing material of the circuit board substrate as optical fibers. The disclosed circuit boards include a plurality of fibers and a dielectric matrix material. Each fiber of the plurality of fibers includes a core material and a cladding material. The core material is substantially transparent to a selected wavelength range radiation. The cladding is selected such that the refractive index of the cladding material is less than a refractive index of the core material (such that the combination of core material and cladding supports total internal reflection of the selected wavelength range of radiation within the core material). The plurality of fibers are interwoven in a weave. The weave is at least partially encapsulated by the dielectric matrix material. The weave provides structural support for the circuit board and a plurality of optical paths for optical signals. In this way, the material used as the structural support for a PCB is used for optical signal conduction, which may allow reduction in electrical traces in the PCB.

Circuit elements, such as semiconductor devices, may be mounted on or at least partially embedded in a PCB. Some PCBs include copper foil conductive material etched to form traces for passing electrical signals into and out of selected circuit elements. Some semiconductor devices include hundreds or thousands of pads (or pins) that allow the semiconductors to communicate with other circuit elements over the PCB traces. As a result, hundreds or thousands of traces may be required to facilitate communication between semiconductor devices and other circuit elements. The increased number of traces uses space, which limits the number of devices that can be placed on a PCB. This limits the density of functions that can be performed on a single PCB.

To reduce the size of a PCB, circuit elements and traces may be positioned relatively close together or stacked on adjacent PCB layers, which results in a higher relative density of circuit elements and traces. The electrical current, however, also generates a magnetic field around the trace. At high currents, switching frequencies, or both, the trace may radiate electromagnetic energy that produces electromagnetic interference (EMI) that may adversely affect neighboring traces or circuit elements, particularly in PCBs areas having a higher relative density of circuit elements. Furthermore, electrical resistance of the traces increases with signal frequency due to trace inductance.

The disclosed circuit boards include a plurality of fibers woven into a weave, each fiber of the plurality of fibers including a core material and a cladding material that are selected to support total internal reflection of a wavelength range of interest, and a dielectric matrix material at least partially encapsulating the weave. Thus, the weave provides both structural support for the circuit board and a plurality of optical paths. The plurality of optical paths may be used to support optical transmission of data between circuit elements disposed on the circuit board. Because the weave provides both structural support and optical paths the thickness and circuit element density of the circuit board is reduced compared to other PCBs. Therefore, the disclosed circuit board may be used in PCBs with at least one of increased circuit element density, reduced PCB size, increased computational speed, and reduced manufacturing time and cost.

Figure 1A:
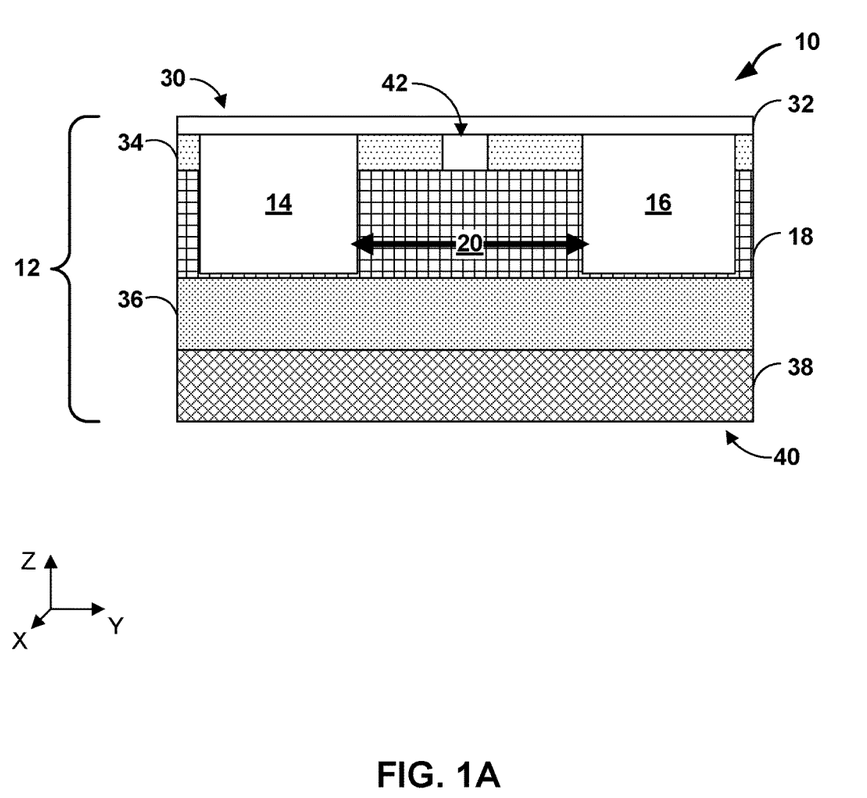
FIGS. 1A and 1B are conceptual and schematic diagrams illustrating a cross-sectional view and a plan view, respectively, of a circuit board that includes woven, clad fibers and a matrix material.
Figure 1B:
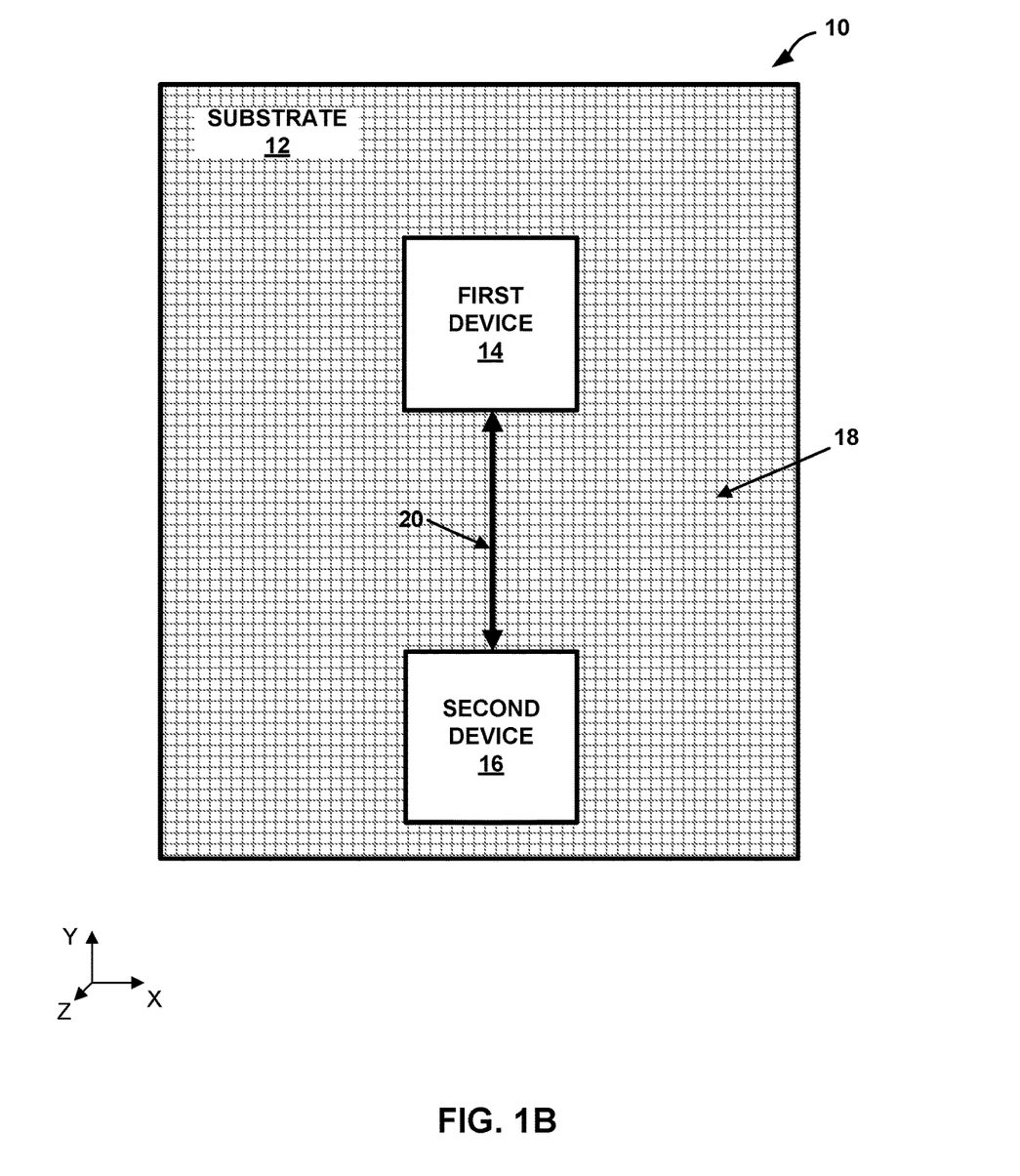

FIGS. 1A and 1B are conceptual and schematic diagrams illustrating a cross-sectional view and a plan view, respectively, of an example circuit board 10 that includes woven, clad fibers and a matrix material. As shown in FIG. 1A, circuit board 10 includes a substrate 12 having a first major surface 30 and a second major surface 40. First major surface 30 and second major surface 40 are substantially planar. In other examples, first major surface 30 and second major surface 40 may be nonplanar, e.g., curved, textured, or the like. Substrate 12 includes first dielectric layer 18, and also may include one or more optional layers, such as, for example, soldermask 32, first conductive layer 34, second conductive layer 36, and second dielectric layer 38. In some examples, circuit board 10 may include fewer layers (e.g., only first conductive layer 34 and first dielectric layer 18) or additional layers (e.g., additional conductive layers, additional dielectric layers, or both).

In the example of FIG. 1A, optional soldermask 32 defines first major surface 30. Soldermask 32 may include a polymer, e.g., a thermoset resin or an epoxy. Soldermask 32 may control the locations on circuit board 10 that retain solder (e.g., during manufacture of circuit board 10), reduce oxidation of underlying layers (e.g., first conductive layer 34), or both. In some examples, substrate 12 may not include soldermask 32. In other examples, substrate 12 may include an additional solder mask defining second major surface 40.

First conductive layer 34 and second conductive layer 36 are optional. Each of first and second conductive layers 34 and 36 may include an electrically conductive material, such as, for example, copper or aluminum. As one example, first conductive layer 34 may include a substantially continuous copper foil on a first major surface of dielectric layer 18, and second conductive layer 36 may include a substantially continuous copper foil on a second major surface of dielectric layer 18. Substantially continuous electrically conductive materials may function as shields for electromagnetic interference (EMI; e.g., EMI originating outside of circuit board 10 that would affect elements of circuit board 10 or EMI originating inside of circuit board 10 that would affect components external to circuit board 10). In other examples, the electrically conductive material may be selectively chemically etched or mechanically removed from desired portions of circuit board 10 (e.g., during manufacture of circuit board 10) to form electrical traces. The electrical traces may be configured to provide power to circuit elements of circuit board 10, conduct data signals between circuit elements of circuit board 10, or both.

First dielectric layer 18 and second dielectric layer 38 may each include a plurality of fibers and a dielectric matrix material. The dielectric matrix material may impregnate or substantially surround the plurality of fibers. The plurality of fibers and dielectric matrix material of at least the first dielectric layer 18 may provide structural support for circuit board 10. In some examples, second dielectric layer 38, additional dielectric layers, or both may also provide structural support for circuit board 10. The plurality of fibers and matrix material enable circuit board 10 to retain a desired shape. Additionally, or alternatively, the plurality of fibers and matrix material enable circuit board 10 to be rigid, flexible, or rigid in selected area of circuit board 10 and flexible in other selected areas of circuit board 10.

Each of soldermask 32, first conductive layers 34, first dielectric layer 18, second conductive layer 36, and second dielectric layer 38 may be substantially continuous or discontinuous in the X-Y plane. For example, as shown in FIG. 1A, first conductive layer 34 is discontinuous in region 42. Region 42 may include a dielectric material, such as the material of soldermask 32. In this way, first device 14 is not electrically coupled to second device 16 via first conductive layer 34. Generally, circuit board 10 may include any number and arrangement of discontinuities in any of soldermask 32, first conductive layers 34, first dielectric layer 18, second conductive layer 36, and second dielectric layer 38. In some examples, discontinuities in soldermask 32 may define areas where solder is adhered to circuit board 10, e.g., by reflowing solder during processing of circuit board 10. In some examples, discontinuities in first conductive layer 34 and second conductive layer 36 may define traces, as discussed above. In other examples, discontinuities in first dielectric layer 18 and second dielectric layer 38 may define through holes, blind vias, buried vias, or the like.

In the example of FIGS. 1A and 1B, each fiber of the plurality of fibers of first dielectric layer 18 includes a core material and a cladding material. For example, each respective fiber of the plurality of fibers includes a core material defining an elongated substantially cylindrical body. The cladding material may be disposed directly on a circumferential surface of the elongated substantially cylindrical body defined by the core material. The core material may be substantially transparent to a selected wavelength range of radiation. The selected wavelength range of radiation may include, for example, at least a portion of the infrared spectrum (e.g., at least one infrared wavelength), at least a portion of the visible spectrum (e.g., at least one visible wavelength), at least a portion of the ultraviolet spectrum (e.g., at least one ultraviolet wavelength), or the like. In some examples, the selected wavelength range of radiation may include two or more selected wavelength ranges of radiation. For example, a first respective transmission optical signal may be at or around a first wavelength and a second respective transmission optical signal may be at or around a second wavelength. Using different wavelengths may have advantages in some applications such as improved photovoltaic efficiency at some wavelengths and reduced interference between signals at the different wavelength.

Example core materials include, but are not limited to, silica glass, fiber glass, E-glass (an alumino-borosilicate glass with less than 1 wt. % alkali oxides), S-glass (an aluminosilicate glass without CaO and with high MgO content), or the like. By selecting a core material that is substantially transparent to a selected wavelength range of radiation, the core material may transmit the selected wavelength of radiation through a selected length of core material. In some examples, the core material may attenuate some radiation, e.g., by absorbing some radiation. The core material may be selected such that the radiation is transmitted through the selected length of core material with an acceptable amount of attenuation.

The core material may be selected to have a desired refractive index (or refractive index range). For example, the refractive index of the core material may be about 1.5, such as between about 1.4 and about 1.6.

Each fiber of the plurality of fibers of first dielectric layer 18 also includes the cladding material. The cladding material is selected to have a refractive index that is less than the refractive index of the core material. For example, the refractive index of the cladding material may be between about 1.1 and about 1.5, or between about 1.2 and about 1.4, or between about 1.2 and about 1.3. Example cladding material include, but are not limited to, acrylate polymers, polyethylene, polyurethane, epoxy resin, silica glass, combinations thereof, or the like. By selecting a cladding material having a refractive index that is less than the refractive index of the core material, each respective fiber of the plurality of fibers may be configured to support total internal reflection of at least a portion of the selected wavelength range of radiation.

In this way, each respective fiber may be configured to transmit optical data. Transmission of optical data in a plurality of fibers of the dielectric layer 18 may present one or more advantages over transmission of data over electrical traces or fiber optic cables that do not provide structural support for circuit board 10. For example, possible advantages include lighter weight; reduced circuit board volume; increased circuit element density; and less susceptibility to electromagnetic interference (EMI), lightning, and electromagnetic pulses (EMP). As another example, transmission of optical data in a plurality of fibers of the dielectric layer 18 may be less sensitive to temperature changes and less susceptible to signal variations (e.g., noise) because of the temperature coefficient of resistivity (TCR) of metal conductive wires. In some examples, transmission of optical data in a plurality of fibers of the dielectric layer 18 may also have improved data transmission capability when compared to metal conductive traces. Transmission of optical data in a plurality of fibers of the dielectric layer 18 may be more secure with respect to signal transmission and possible interception or security intrusions when compared to metal conductive traces. In some examples, transmission of optical data in a plurality of fibers of the dielectric layer 18 may be more difficult to jam or intercept, when compared to wireless signals or electrical traces.

The dielectric matrix material may include any suitable dielectric material to form a matrix around the plurality of fibers. In some examples, the dielectric matrix material includes a thermoset resin, an epoxy, or the like. In some examples, the dielectric matrix material may be opaque to the selected wavelength of interest. For example, the dielectric matrix material may attenuate at least a portion of the selected wavelength range of radiation. By attenuating at least a portion of the selected wavelength range of radiation, an opaque dielectric matrix material may prevent radiation travelling between respective fibers of the plurality of fibers. For example, in the case of a fiber configured for total internal reflection of radiation incident on the interface of the core material and the cladding material at an angle less than a critical angle, radiation incident on the interface of the core material and the cladding material at an angle greater than a critical angle (which escapes a boundary of the cladding material) may be absorbed by the opaque dielectric matrix material.

The plurality of fibers may be arranged in any suitable architecture that supports total internal reflection through at least a portion of the length of a respective fiber of the plurality of fibers. For example, a respective fiber of the plurality of fibers may be configured for total internal reflection of radiation incident on the interface of the core material and the cladding material or an end of the core material at an angle less than a critical angle. Radiation incident on the interface of the core material and the cladding material or an end of the core material at an angle greater than a critical angle may escape the respective fiber. Suitable architectures include, but are not limited to a unidirectional tape, a braid, or a weave. For example, a unidirectional tape architecture includes a plurality of fibers arranged in substantially one direction along a common plane (e.g., extending substantially parallel to the y-axis in the x-y plane).

In examples in which the architecture includes a braid or a weave, the braid or the weave may include a plurality strands. Each respective strand of the plurality of strands includes at least one tow (e.g., yarn), and each tow includes a plurality of fibers. For example, a braided architecture includes a plurality of strands (defined by at least one tow having a plurality of fibers), where the at least two strands are braided in a repeating or nonrepeating pattern. Any suitable braiding technique may be used to form a braided architecture, such as, for example, 2-D braiding, 3-D braiding, circular braiding, over-braiding, four-step braiding, two-step braiding, rotary braiding, and the like. A braided architecture may improve load distribution compared to other architectures (e.g., unidirectional tapes) to increase the mechanical strength of circuit board 10. As one example, a braided architecture may reduce crack propagation by arresting cracking at the intersection of a first tow and a second tow of the at least two tows.

A woven architecture may include a plurality of fibers defining weft fibers and warp fibers. The weft fibers and warp fibers are woven in a repeating or nonrepeating pattern. For example, a woven architecture may include any suitable weave, such as a one-by-one weave, a two-by-two twill weave, a satin weave, a basket weave, a leno weave, a mock leno weave, a unidirectional weave, and patterned weaves. The weft fibers may include single fibers or bundles of a plurality of weft fibers, such as, for example, weft tows or weft strands. Similarly, the warp fibers may include single warp fibers or bundles of a plurality of warp fibers, such as, for example, warp tows or warp strands. For example, respective sets of fibers from the plurality of fibers may be collected in respective fiber bundles. The respective fiber bundles may be woven in a woven fabric that includes weft fiber bundles and warp fiber bundles. In examples in which weft fibers or warp fibers include fiber bundles, the weft fiber bundles, warp fiber bundles, or both may include any suitable number of fibers per bundle (e.g., greater than 10 fibers per bundle, greater than 100 fibers per bundle, greater than 1,000 fibers per bundle, greater than 10,000 fibers per bundle, or the like). Additionally, a woven architecture may include any suitable thread count (e.g., ten-by-ten, twenty-by-twenty, thirty-by-thirty, or the like). A woven architecture may improve load distribution compared to other architectures (e.g., unidirectional tapes) to increase the mechanical strength of circuit board 10. As one example, a woven architecture may reduce crack propagation by arresting cracking at a respective pick (e.g., an intersection of a weft fiber and warp fiber).

In examples in which the plurality of fibers are arranged as a woven fabric that includes weft fiber bundles and warp fiber bundles, the weft fiber bundles, warp fiber bundles, or both may include a cladding material disposed directly on a surface defined by the respective bundle. For example, at least one weft fiber bundle may include a cladding material, whereas the other weft fiber bundles and warp fiber bundles do not include a cladding material. In other examples, at least one warp fiber bundle may include a cladding material, whereas the other warp fiber bundles and weft fiber bundles do not include a cladding material. In this way, the woven fabric may be selected to include a desired number of clad fiber bundles that are configured to support total internal reflection of a selected wavelength range of radiation.

In some examples, second dielectric layer 38 may be the same or substantially similar to first dielectric layer 18. For example, each fiber of the plurality of fibers of second dielectric layer 38 may include a core material and a cladding material, and the dielectric matrix material may include any suitable dielectric material to form a matrix around the plurality of fibers, as discussed above with respect to first dielectric layer 18. In other examples, second dielectric layer 38 may include a different plurality of fibers, a different dielectric matrix material, or both compared to first dielectric layer 18. For example, second dielectric layer 38 may include any suitable dielectric substrate, such as FR-2, FR-3, FR-4, FR-5, FR-6, G-10, CEM-1, CEM-2, CEM-3, CEM-4, CEM-5, combinations thereof, or the like.

Circuit board 10 may include a plurality of circuit elements, two of which circuit elements, e.g., first device 14 and second device 16, are shown in FIGS. 1A and 1B. First device 14 and second device 16 may include active circuit elements, such as, for example, semiconductor devices, or passive circuit elements. As shown in FIG. 1A, first device 14 and second device 16 are embedded in circuit board 10. In other examples, first device 14 and second device 16 may be disposed on a surface of circuit board 10 (e.g., first major surface 30) or partially embedded in circuit board 10, or a combination thereof.

In the example of FIGS. 1A and 1B, first device 14 and second device 16 include at least one of an optical transmitter or an optical receiver in addition to the active or passive circuit elements. For example, first device 14 may include an optical transmitter and second device 16 may include an optical receiver. The optical transmitter converts electrical signals to optical signals. The optical receiver converts optical signals to electrical signals. In other examples, each of first device 14 and second device 16 may include an optical transceiver (an optical transmitter and an optical receiver).

As illustrated in FIGS. 1A and 1B, at least one fiber of the plurality of fibers of dielectric layer 18 is configured to support total internal reflection along optical data transmission path 20 between first device 14 and second device 16. In this way, optical data transmission path 20 may be configured to transmit optical signals from an optical transmitter to an optical receiver. For example, an optical transmitter of first device 14 (or second device 16) may emit radiation with a selected wavelength or wavelength range along optical data transmission path 20 to an optical receiver of second device 16 (or first device 14). In examples in which the plurality of fibers is arranged in a weave, as discussed above, at least one weft fiber (or warp fiber) may be positioned relative to the optical transmitter and the optical receiver such that the at least one weft fiber (or warp fiber) defines optical data transmission path 20. By optically coupling the at least one optical transmitter of first device 14 (or second device 16) to the optical receiver of second device 16 (or first device 14) via optical data transmission path 20, circuit board 10 enables optical communication (e.g., transmission of data using optical signals) from first device 14 to second device 16, or vice versa.

In some examples, circuit board 10 may include more than two circuit elements. For example, circuit board 10 may include three or more circuit elements, such as tens or hundreds of circuit elements. Generally, each circuit element may be optically coupled to one or more different circuit elements. In some examples, optical data transmission path 20 may be configured to be transmitted from circuit board 10 to a second different circuit board. For example, optical data transmission path may include one or more coupling devices coupled to a first respective fiber of a plurality of fibers (or a first respective bundle of fibers of a plurality of fibers) of circuit board 10 to a second respective fiber of a plurality of fibers (or a second respective bundle of fibers of a plurality of fibers) of a second different circuit board. In this way, a circuit element on circuit board 10 (e.g., first device 14 or second device 16) may be configured to optically communicate with a different circuit device on a second different circuit board.

Figure 2:
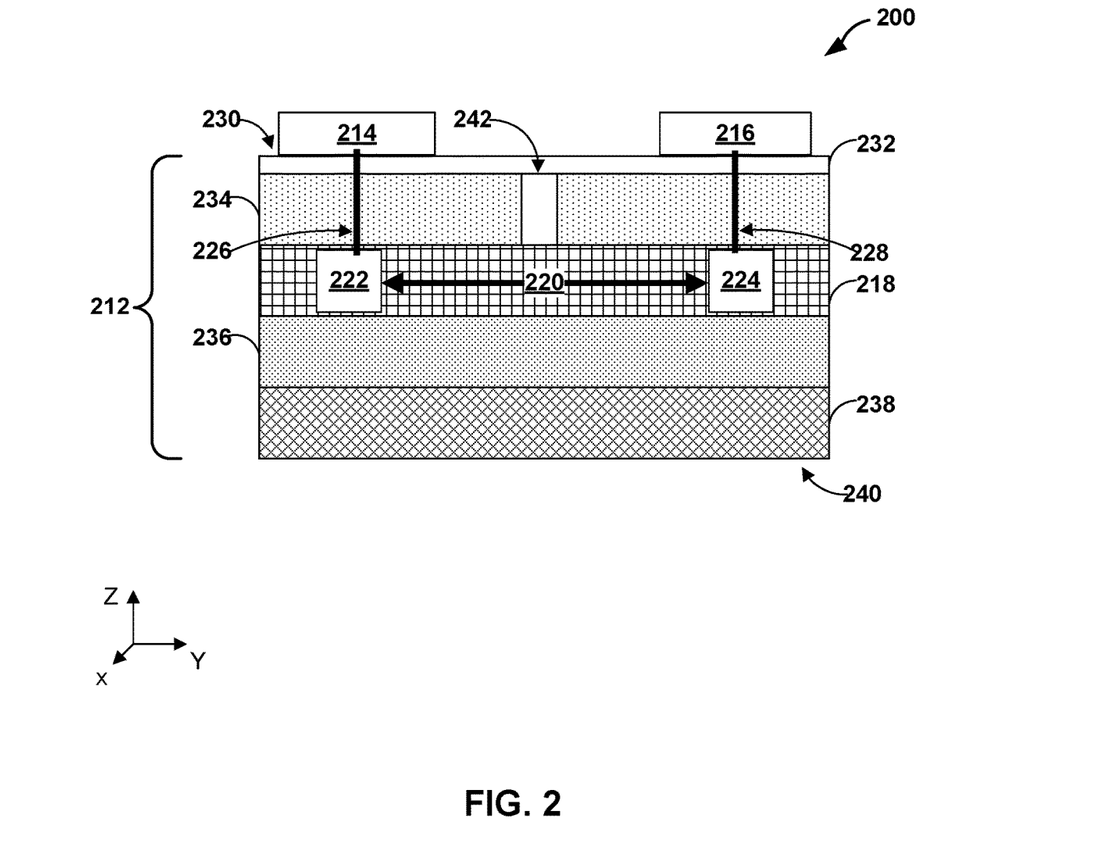
FIG. 2 is a conceptual and schematic diagram illustrating a cross-sectional view of a circuit board that includes woven, clad fibers and a matrix material.

In some examples, each of first device 14 and second device 16 may be communicatively coupled to a respective optical transmitter, optical receiver, or optical transceiver. FIG. 2 is a conceptual and schematic diagram illustrating a cross-sectional view of a circuit board 200 that includes woven, clad fibers and a matrix material. Circuit board 200 may be the same or substantially similar to circuit board 10 of FIGS. 1A and 1B except for the differences describe herein. For example, circuit board 200 includes a substrate 212 having a first major surface 230 and a second major surface 240. Substrate 212 includes a plurality of layers, such as soldermask 232, first conductive layers 234, first dielectric layer 218, second conductive layer 236, and second dielectric layer 238. Substrate 212 may include more or fewer layers, as described with respect to circuit board 10. Region 242 includes a dielectric material such that first device 214 and second device 216 are not electrically coupled.

As shown in FIG. 2, first device 214 is communicatively coupled to a first optical transceiver 222 via first trace 226 and second device 216 is communicatively coupled to a second optical transceiver 224 via second trace 228. First device 214 and second device 216 are mounted to first major surface 230. In other examples, first device 214 and second device 216 may be embedded or partially embedded in circuit board 200. First trace 226 and second trace 228 may include conductive material traces, e.g., buried vias, as discussed above. For example, first trace 226 and second trace 228 may include at least a portion of first conductive layer 234, and extend through at least a portion of soldermask 232 and at least a portion of first dielectric layer 218. In some examples, more than one circuit element may be coupled to a respective optical transceiver via at least one trace. For example, first optical transceiver 222, second optical transceiver, or both may be coupled to a plurality of circuit elements. In this way, circuit board 200 may be configured to enable optical communication between at least two circuit elements via an optical communication path 220 defined by a plurality of fibers of dielectric material layer 218.

Figure 3A:
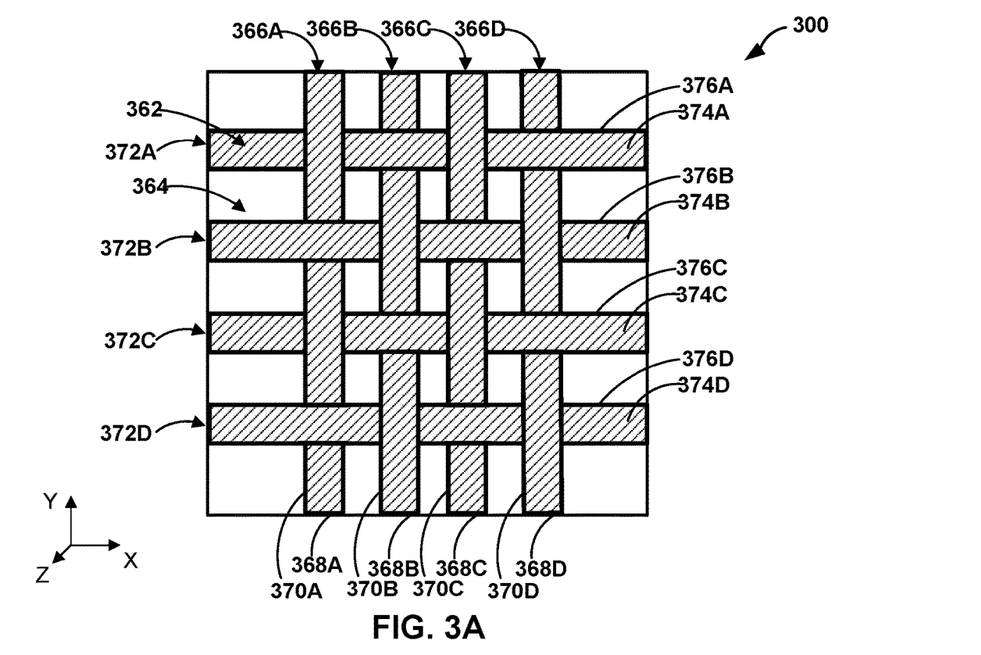
FIGS. 3A and 3B are conceptual and schematic diagrams illustrating a plan view and a cross-sectional view of an example woven fabric and a matrix material of a circuit board.
Figure 3B:
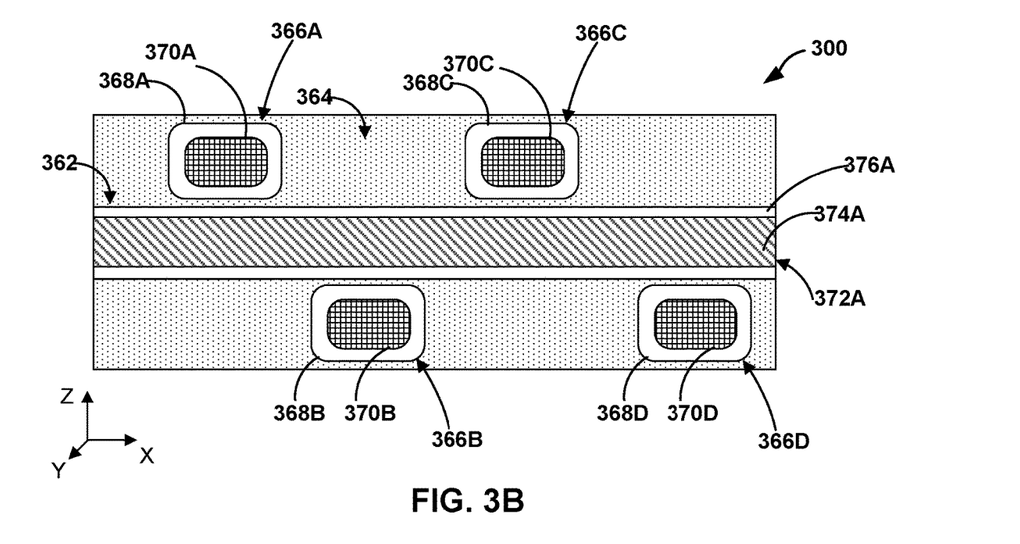

FIGS. 3A and 3B are conceptual and schematic diagrams illustrating a plan view and a cross-sectional view, respectively, of an example woven fabric 362 and a matrix material 364 of a dielectric material layer 300 of a circuit board. As discussed with respect to FIG. 1, woven fabric 362 may include a plurality of warp strands 366A, 366B, 366C, and 366D (collectively, "warp strands 366") and a plurality of weft strands 372A, 372B, 372C, and 372D (collectively, "weft strands 372"). As shown in FIG. 3A, the woven architecture of woven fabric 362 is a one-by-one weave. In other examples, woven fabric 362 may define other types of weaves as discussed above. Warp strands 366 include, respectively, core material 368A, 368B, 368C, and 368D and cladding material 370A, 370B, 370C, and 370D. Similarly, weft strands 372 include, respectively, core material 374A, 374B, 374C, and 374D and cladding material 376A, 376B, 376C, and 376D. As discussed above with respect to FIG. 1, the core material 368A-368D and 374A-374D and cladding material 370A-370D and 376A-376D may be selected to support total internal reflection of a selected wavelength of radiation in the core material. In this way, at least one of warp strands 366, at least one of weft strands 368, or both may be configured to transmit optical data. Woven fabric 362 may include any of the weaves described above.

Figure 4:
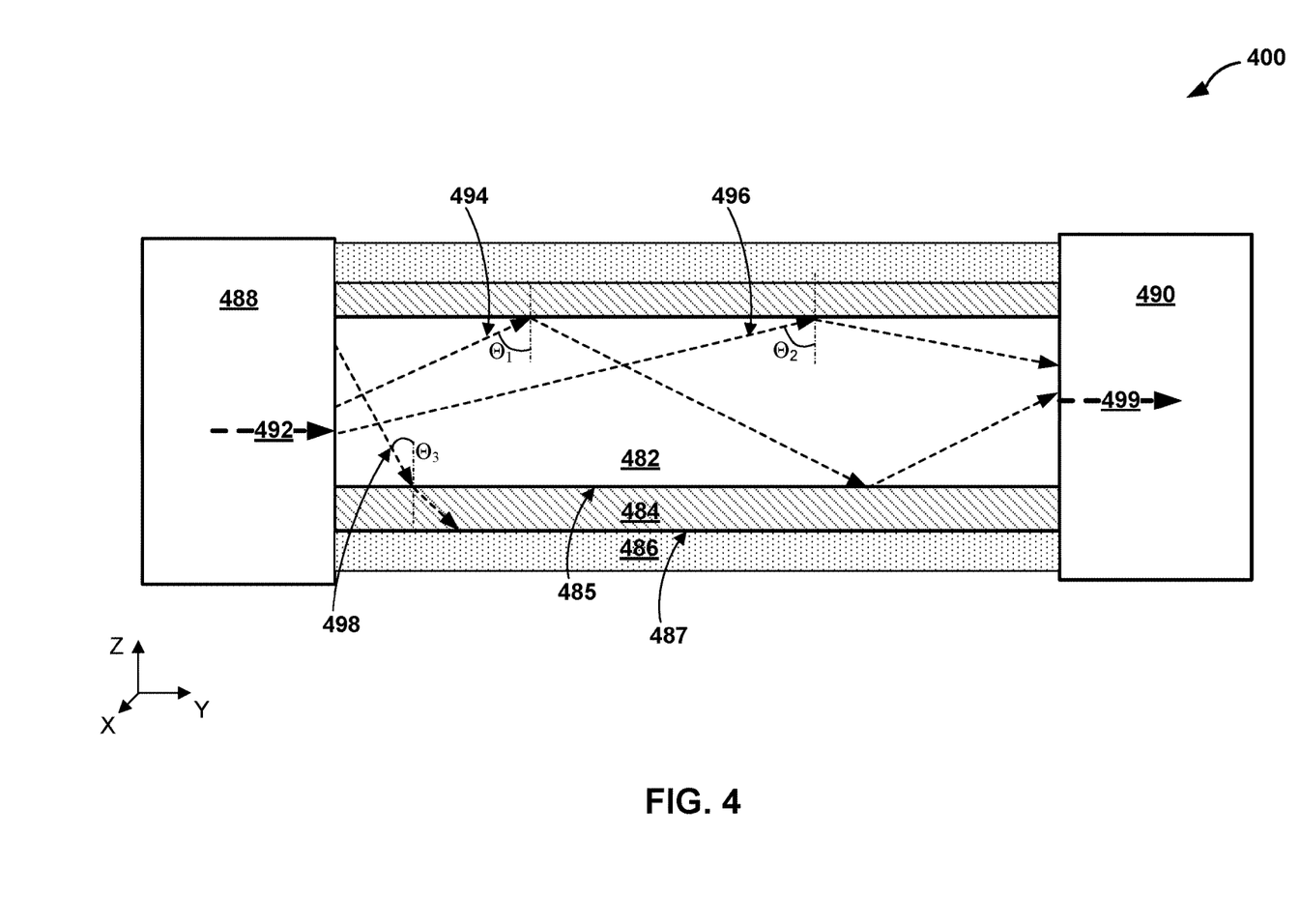
FIG. 4 is a conceptual and schematic diagram illustrating a cross-sectional view of a circuit board showing total internal reflection of a selected wavelength of radiation travelling through an example clad fiber of the circuit board.

Total internal reflection in a respective fiber of a plurality of fibers (e.g., a respective strand of a plurality of strands) may substantially reflect a selected wavelength of radiation such that the intensity of light entering the respective fiber does not significantly diminish as the light travels from a first end of the respective fiber to a second end of the respective fiber. FIG. 4 is a cross-sectional view of conceptual and schematic diagram illustrating total internal reflection of a selected wavelength of radiation travelling through an example clad fiber 400 of a circuit board. Clad fiber 400 includes core material 482 and cladding material 484, and is encapsulated in opaque matrix material 486. Clad fiber 400 is optically coupled to optical transmitter 488 and optical receiver 490. Optical transmitter 488 and optical receiver 490 may be the same or substantially similar to first device 14 and second device 16, respectively, of FIG. 1A, or first optical transceiver 222 and second optical transceiver 224, respectively, of FIG. 2. In this way, clad fiber 400 may be configured to support total internal reflection of a selected wavelength of radiation from optical transmitter 488 to optical receiver 490.

For example, as shown in FIG. 4, optical transmitter 488 is configured to emit a first selected wavelength of radiation 492. First selected wavelength of radiation 492 may include a plurality of waves (e.g., light rays) that enter clad fiber 400 at one or more angles. For example, first selected wavelength of radiation 492 may be substantially collimated such that the plurality of waves of first selected wave length of radiation 492 are substantially parallel. In other examples, first selected wavelength of radiation 492 may include a plurality of divergent waves.

Total internal reflection of first selected wavelength of radiation 492 occurs when a respective wave of the plurality of waves is incident on boundary 485 (between core material 482 and cladding material 484) at an angle larger than a critical angle with respect to the normal to the surface of boundary 485. The critical angle is the angle of incidence for which the angle of refraction is 90° relative to the normal at the refractive boundary 485 (e.g., the wave would travel parallel to boundary 485). The critical angle ($\Theta_c$) may be expressed as $\Theta_c = \arcsin(n_2/n_1)$, where $n_1$ is the refractive index of the core material, and $n_2$ is the refractive index of the cladding material. For example, as shown in FIG. 4, first wave 494 is incident on boundary 485 at angle $\Theta_1$ which is greater than the critical angle. Similarly, second wave 496 is incident on boundary 485 at angle $\Theta_2$ which is greater than the critical angle. Optical signal 499 is received by optical receiver 490. In this way, optical fiber 400 may propagate an optical signal emitted from optical transmitter 488 to optical receiver 490. In this way, core material 482 and cladding material 484 may be selected to support total internal reflection of a selected wavelength of radiation at a desired range of incident angles.

When the angle of incidence is less than the critical angle, at least a portion of the wave may cross the boundary (the remaining portion being reflected). For example, third wave 498 is incident on boundary 485 at angle $\Theta_3$ which is less than the critical angle. Rather than being reflected, at least a portion of third wave 498 may refracted and travel through cladding material 484. The at least portion of third wave 498 that travels through cladding material 484 may strike the boundary of cladding material 484 and opaque matrix material 486 and be absorbed by opaque matrix material 486. By absorbing the at least portion of third wave 498, the opaque matrix material may absorb optical radiation that escapes the clad fiber 400. Absorbing optical radiation that escapes clad fiber 400 may make interception of the optical data more difficult.

Figure 5:
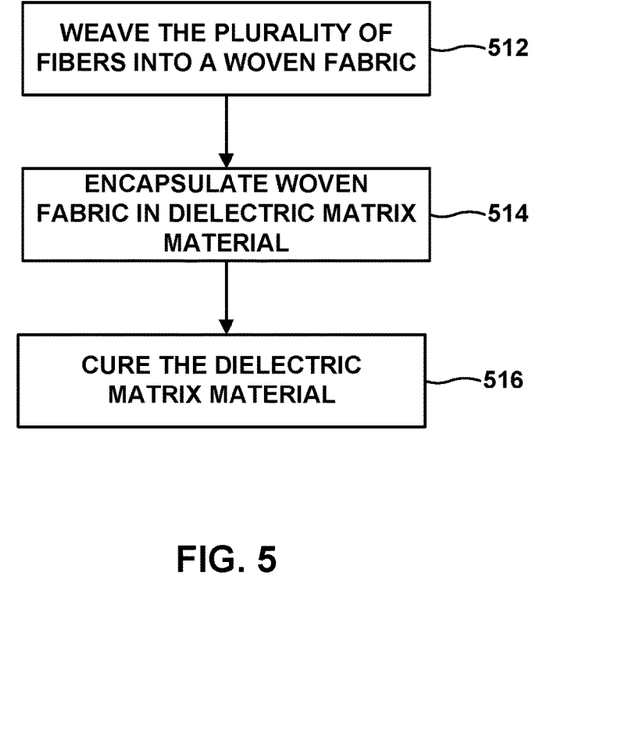
FIG. 5 is a flow diagram illustrating an example method for manufacturing a circuit board that includes woven, clad fibers and a matrix material.

The circuit board described herein may be formed using a variety of techniques, including for example, pre-preg and cure, resin transfer molding, or the like. FIG. 5 is a flow diagram illustrating an example method for manufacturing a circuit board. The technique of FIG. 5 will be described with reference to circuit board 10 of FIGS. 1A and 1B, although one of ordinary skill in the art will appreciate that similar techniques may be used to form other circuit boards, e.g., circuit board 200 of FIG. 2, circuit board 300 of FIGS. 3A and 3B, and the like.

The technique of FIG. 5 includes weaving a plurality of fibers to form a woven fabric defining a geometry of circuit board 10 (512). Optionally, the technique may include, before or after weaving the plurality of fiber, cladding at least one selected fiber of core material (e.g., strand of core material). In some examples, weaving the plurality of fibers to form a woven fabric defining a geometry of circuit board 10 (512) may include positioning the reinforcement elements in a selected orientation, a selected location, or both. For example, as described above, circuit board 10 may include an optical data transmission path 20 between a first device 14 and a second device 16. Optical data transmission path 20 may be in a selected orientation and a selected location to enable first device 14 to be optically coupled to second device 16 after first device 14 and second device 16 are embedded in circuit board 10.

The technique in FIG. 5 includes encapsulating the woven fabric in a dielectric matrix material (514). In some examples, the dielectric matrix material (e.g., an uncured form of the dielectric matrix material) may be introduced around at least some of the plurality of fibers prior to weaving the plurality of fibers. For example, at least some of the plurality of fibers may be in a weave of a pre-impregnated plurality of fibers, in which an uncured or partially cured form of the dielectric matrix material at least partially surrounds at least a portion of the plurality of fibers. In some examples, the dielectric material may be introduced around the plurality of fibers after weaving the plurality of fibers. For example, resin transfer molding may be used to introduce dielectric matrix material or a precursor of dielectric matrix material into a mold that contains the woven fabric. Once the woven fabric is encapsulated in the dielectric matrix material (514), the matrix material may be cured. The dielectric matrix material may be cured by introducing energy into the matrix material, e.g., via convention, conduction, infrared radiation, ultraviolet radiation, or the like.

After curing the dielectric matrix material (516), the technique in FIG. 5 may optionally include embedding circuit elements, including at least one of an optical transmitter, an optical receiver, or an optical transceiver, in the circuit board. In other examples, embedding the circuit elements may include embedding circuit elements prior to curing (516). Embedding the circuit elements may include drilling or machining a hole in at least a portion of the circuit board that extends into at least a portion of a respective fiber of the plurality of fibers. Embedding the circuit elements in the circuit board may include aligning at least a portion of the circuit element with at least one respective fiber of the plurality of fibers. For example, a circuit element may be aligned in a drilled or machined hole that extends into at least a portion of a respective fiber of the plurality of fibers. In this way, the circuit elements may be positioned adjacent a selected optical fiber to enable the circuit element to transmit or receive light via the at least on respective fiber of the plurality of fibers.

Various examples of the disclosure have been described. These and other examples are within the scope of the following claims.

The invention claimed is:

1. A circuit board comprising:
 a plurality of fibers, wherein each fiber of the plurality of fibers comprises a core material substantially transparent to a wavelength range of interest and a cladding material, wherein the refractive index of the cladding material is less than a refractive index of the core material, and wherein the plurality of fibers are woven in a woven fabric comprising weft fibers and warp fibers;

a dielectric matrix material, wherein the woven fabric is at least partially encapsulated by the dielectric matrix material, and wherein the woven fabric provides structural support for the circuit board and a plurality of optical paths for optical signals;

an optical transmitter; and an optical receiver, wherein at least one of the optical transmitter or the optical receiver is embedded in the circuit board, and wherein the optical transmitter and the optical receiver are optically coupled to at least one fiber of the plurality of fibers to transmit optical signals from the optical transmitter to the optical receiver.

2. The circuit board of claim 1, wherein respective sets of fibers from the plurality of fibers are collected in respective fiber bundles, and wherein the woven fabric comprises weft fiber bundles and warp fiber bundles.

3. The circuit board of claim 1, wherein the refractive index of the core material is about 1.5, and wherein the refractive index of the cladding is less than about 1.4.

4. The circuit board of claim 1, wherein the dielectric matrix material comprises a thermoset resin or epoxy.

5. The circuit board of claim 1, wherein the dielectric matrix material is opaque to the wavelength range of interest.

6. The circuit board of claim 1, further comprising a substantially continuous copper foil on at least one side of a layer formed by the plurality of fibers and the dielectric matrix material.

7. The circuit board of claim 1, wherein exterior surfaces of the circuit board are substantially planar.

8. The circuit board of claim 1, further comprising a layer comprising electrically conductive traces.

9. The circuit board of claim 1, wherein all fibers in the circuit board include the core material substantially transparent to the wavelength range of interest and the cladding material.

10. A method of forming a circuit board, the method comprising:

weaving a plurality of fibers to define a woven fabric comprising weft fibers and warp fibers, wherein each fiber of the plurality of fibers comprises a core material substantially transparent to a wavelength range of interest and a cladding material, wherein the refractive index of the cladding material is less than a refractive index of the core material;

at least partially encapsulating the woven fabric in a dielectric matrix material, and wherein the woven fabric provides structural support for the circuit board and a plurality of optical paths for optical signals; and embedding at least one of an optical transmitter or an optical receiver in the circuit board, wherein the optical transmitter and the optical receiver are optically coupled to at least one fiber of the plurality of fibers to transmit optical signals from the optical transmitter to the optical receiver.

11. The method of claim 10, wherein respective sets of fibers from the plurality of fibers are collected in respective fiber bundles, and wherein weaving comprises weaving the respective fiber bundles comprising weft fiber bundles and warp fiber bundles into a woven fabric.

12. The method of claim 10, wherein the refractive index of the core material is about 1.5, and wherein the refractive index of the cladding is less than about 1.4.

13. The method of claim 10, wherein the dielectric matrix material comprises a thermoset resin or epoxy.

14. The method of claim 10, wherein the dielectric matrix material is opaque to the wavelength range of interest.

15. The method of claim 10, further comprising forming a substantially continuous copper foil on at least one side of a layer formed by the plurality of fibers and the dielectric matrix material.

16. The method of claim 10, further comprising forming exterior surfaces of the circuit board to be substantially planar.

17. The method of claim 10, further comprising incorporating a layer comprising electrically conductive traces in the circuit board.

18. The method of claim 10, wherein all fibers in the circuit board include the core material substantially transparent to the wavelength range of interest and the cladding material.

* * * * *